United States Patent [19]

Ordidge

[11] Patent Number: 4,906,932
[45] Date of Patent: Mar. 6, 1990

[54] NMR SPECTROSCOPY AND NMR IMAGING

[75] Inventor: Roger J. Ordidge, Nottingham, England

[73] Assignee: National Research Development Corporation, London, England

[21] Appl. No.: 213,809

[22] Filed: Jun. 30, 1988

[30] Foreign Application Priority Data

Jun. 30, 1987 [GB] United Kingdom ............... 8715302

[51] Int. Cl.$^4$ ........................................... G01R 33/20
[52] U.S. Cl. .................................................... 324/309
[58] Field of Search ....................... 324/309, 313, 314

[56] References Cited

U.S. PATENT DOCUMENTS 4,703,267 10/1987 Maudsley ........................... 324/309

Primary Examiner—Michael J. Tokar
Assistant Examiner—Lawrence Fess
Attorney, Agent, or Firm—Cushman, Darby & Cushman

[57] ABSTRACT

Undesired signals are eliminated using a shaped RF pulse comprising a region of random frequency components and a region of zero components to effectively eliminate signals from areas volumes or frequency bands which are not required.

10 Claims, 4 Drawing Sheets

NMR SPECTROSCOPY AND NMR IMAGING

The present invention relates to NMR spectroscopy and NMR imaging and more particularly to the selection of a small volume of material from within a much larger sample.

In order to select a small volume of material from a much larger sample, a successful spatial localization technique must be capable of eliminating the unwanted signal from a large volume of the surrounding material. Selection of a cubic volume of tissue within a specimen which is ten times larger along all three axes, necessitates that the signal contribution from material outside the cube can be reduced by at least a factor of 10000. This suppression ratio would only ensure that the measured signal from within the cube is ten times larger than the error signal. In practice, a suppression ratio of at least 20000 is desirable to reduce the error signal below the noise level usually found in in-vivo phosphorous spectroscopy.

Known mechanisms for signal suppression vary between techniques. Several methods however rely upon signal cancellation following the application of a series of experiments. The ISIS R. J. Ordidge, A. Connely and J. A. B. Lohman; J. Magn. Reson. 66, 283 (1986) and VSE W. P. Aue, S. Mueller, T. A. Cross and J. Seelig; J. Magn. Reson. 56, 350 (1984) techniques both rely on this principle, and require accurate cancellation of large signal amplitudes in order to detect relatively small signals originating from the volume of interest. The cancellation is prone to instabilities in the main magnetic field, the magnetic field gradients, the NMR spectrometer system and motion of the sample.

D. D. Doddrell, G. G. Galloway, W. M. Brooks, J. M. Bulsing, J. C. Field, M. G. Irving and H. Baddeley; Magn. Reson. Med. 3, 970 (1986) have described a radiofrequency (RF) pre-pulse which destroys longitudinal spin magnetization in the unwanted regions of the sample by application of a selective $\pi/2$ spin nutation. The transverse magnetization is then allowed to decay prior to the application of a suitable spatial localization technique. The method relies on the application of a high power selective RF pulse using a homogeneous transmitter coil. This ensures that most of the unwanted spin magnetization undergoes an accurately determined $\pi/2$ nutation. In practice, the combination of high RF power, and a homogeneous RF coil which completely surrounds the sample, is only found in small and medium bore in-vivo spectrometer systems. For whole-body in-vivo spectroscopy studies, the RF power requirement would be considerable and may well exceed the current safety guidelines for such equipment.

A similar technique called LOCUS spectroscopy has been proposed by A. Haase; Magn. Reson. Med. 3, 963 (1986). In this method the unwanted magnetization is effectively removed by a sequence of selective $\pi/2$ pulses. The LOCUS technique requires a highly homogeneous RF coil, and a second experiment is needed to remove the effect of spin lattice relaxation.

It is an object of the present invention to provide a method of eliminating unwanted signals to assist in enhancing wanted signals.

According to the present invention there is provided a method of eliminating signals from unwanted frequency bands in NMR systems by using a shaped RF pulse comprising at least two regions of random frequency components between which at least one region of zero components is situated.

It is a further object of the present invention to provide a method for selection of a small volume of material from within a much larger sample which is highly efficient in the use of RF power and which provides good selectivity.

According to the present invention there is also provided a method of more accurate definition of a small volume of material in NMR systems within a larger sample by removal of unwanted signals through the application of a shaped RF pulse in conjunction with a linear magnetic field gradient which effectively randomises the net longitudinal spin magnetization in all volumes outside the selected volume.

The selective pre-pulse can be followed by a suitable spatial localization technique such as ISIS, R. J. Ordidge, A. Connely and J. A. B. Lohman; J. Magn. Reson. 66, 283 (1986) or VSE W. P. Aue, S. Mueller, T. A. Cross and J. Seelig; J. Magn. Reson. 56, 350 (1984).

Embodiments of the present invention will now be described, by way of example with reference to the accompanying drawings in which.

Figure 1A:
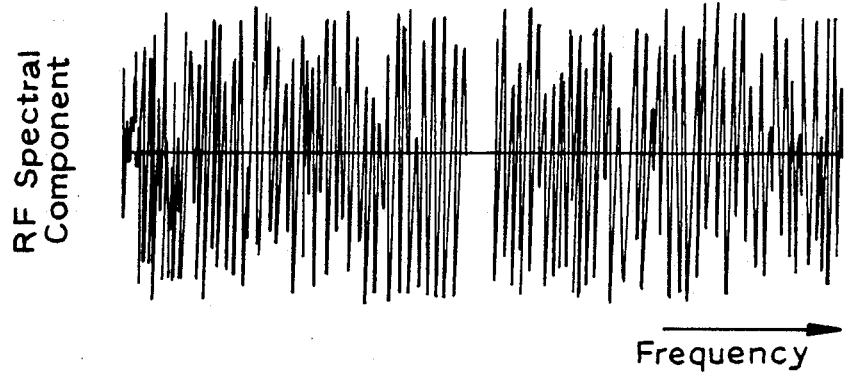
FIG. 1A shows the distribution of components in the real frequency domain which form the irradiation spectrum for a selective noise pulse. Twenty points in the centre of the 512 point spectrum are set to zero in both real and imaginary domains.
Figure 1B:
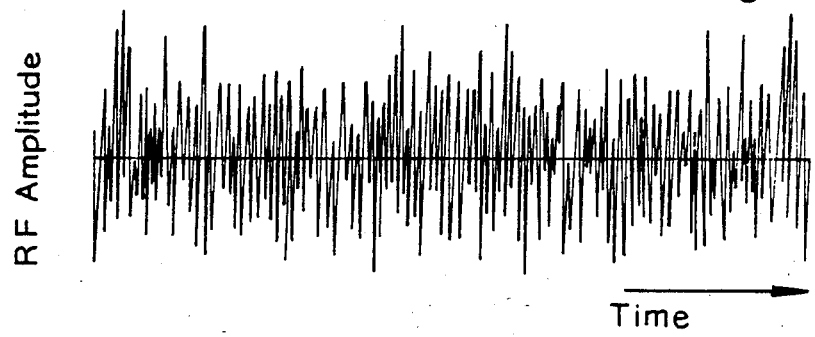
FIG. 1B shows the selective RF pulse shape obtained by Fourier transformation of the data in FIG. 1A. A similar function is obtained in the imaginary time domain.
Figure 1C:
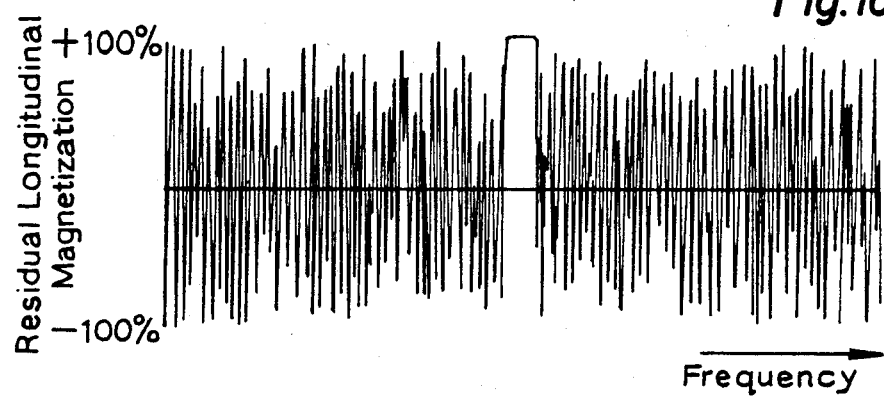
Figure 2:
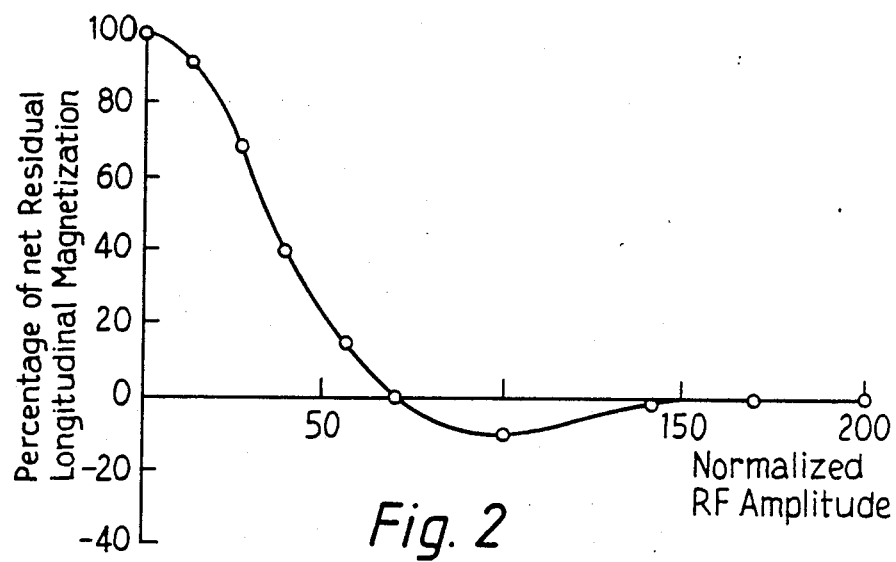
Figure 3:
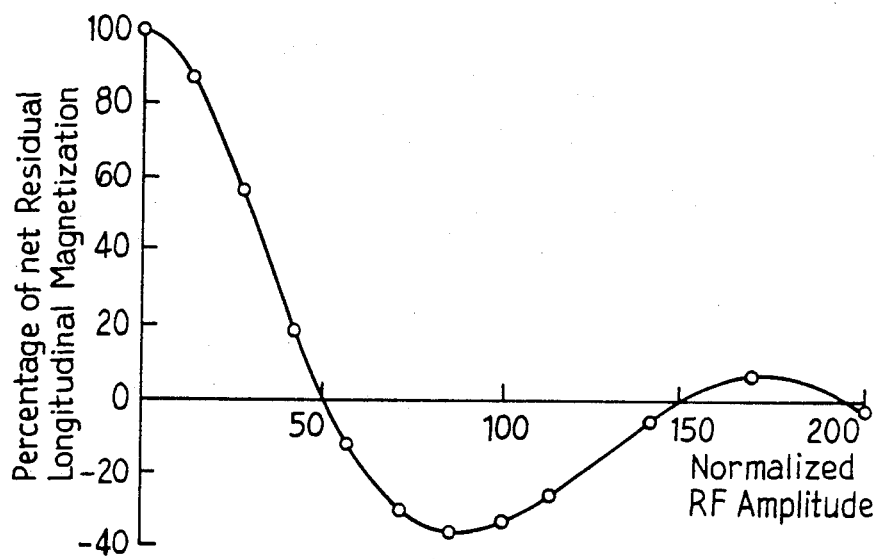

FIG. 1C shows a computer simulation of the effect of the selective pulse shown in FIG. 1B applied in combination with a magnetic field gradient upon a uniform spin distribution. The vertical axis represents the residual longitudinal magnetization following the pulse and is plotted as a function of position in the linear magnetic field gradient. The RF amplitude was chosen to give a minimum net longitudinal magnetization outside the unperturbed slice;

FIG. 2 shows a plot showing the percentage of net residual longitudinal magnetization outside the unperturbed slice, plotted as a function of the normalized RF amplitude of a quadrature selective pulse with two independent random frequency components. An RF amplitude of one corresponds to a non-selective $\pi/2$ RF pulse of equal duration;

FIG. 3 shows a plot showing the percentage of net residual longitudinal magnetization outside the unperturbed slice, plotted as a function of the normalized RF amplitude of a quadrature selective pulse with frequency components defined in polar co-ordinates. The frequency components were specified by a constant amplitude and a random phase angle which could vary between $\pm\pi$. An RF amplitude of one corresponds to a non-selective $\pi/2$ RF pulse of equal duration.

Figure 4:
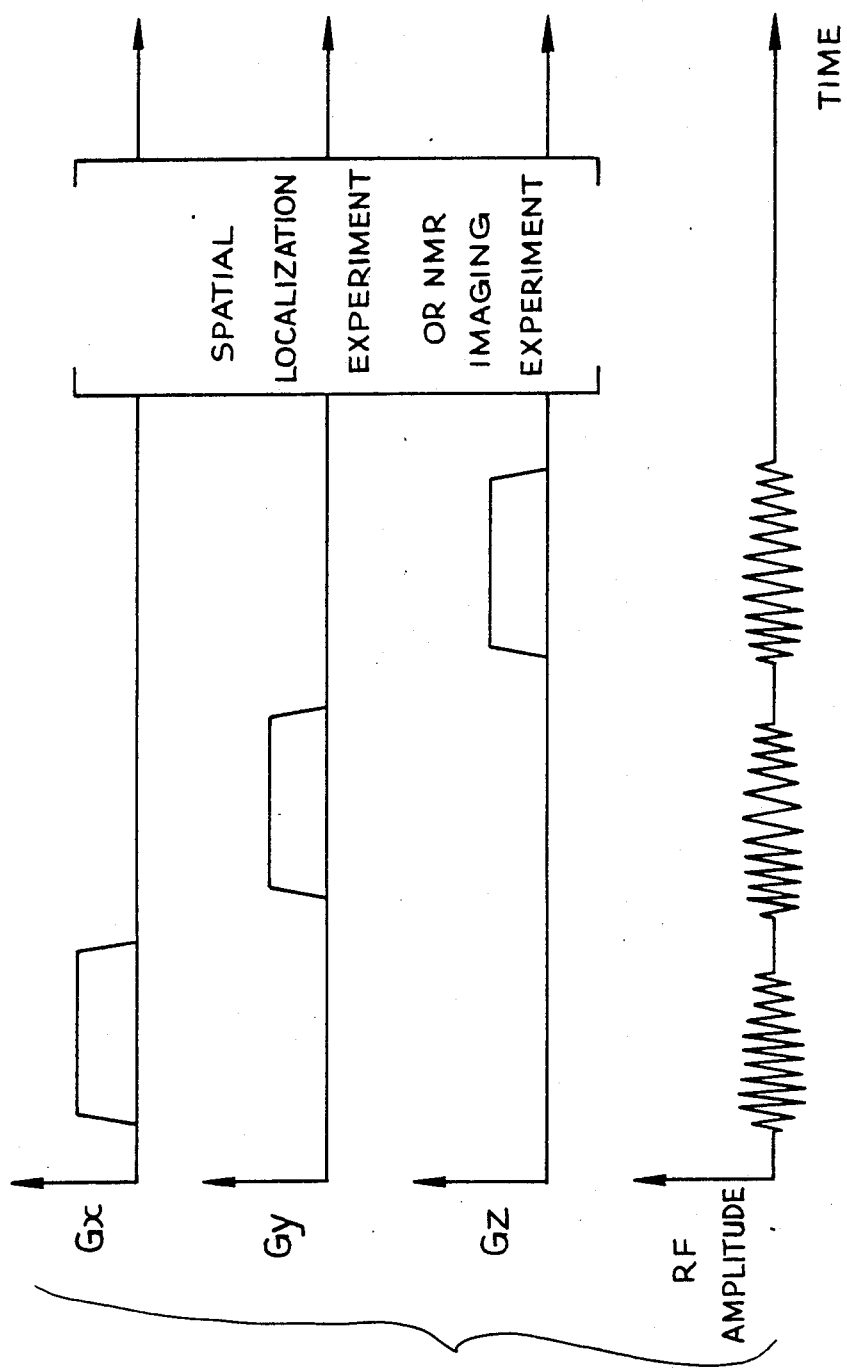
Figure 5A:
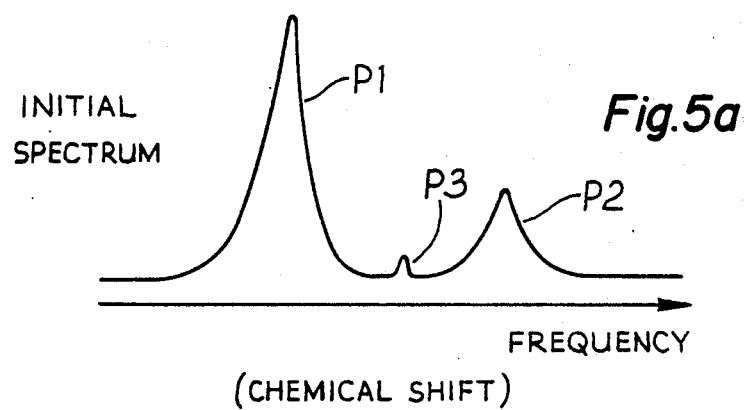
Figure 5B:
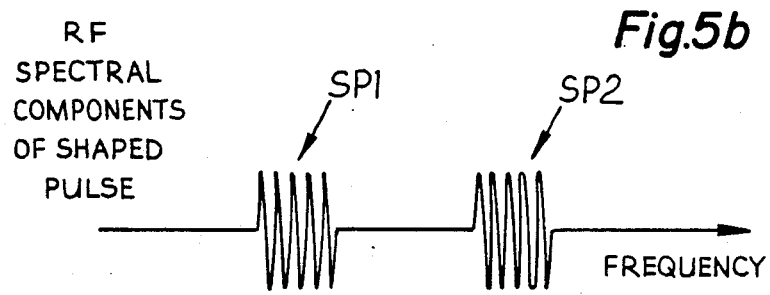

FIG. 4 shows sequence timing diagrams illustrating the principles of the present invention for spatial localization and elimination in three dimensions (X, Y and Z); and FIG. 5 shows the principles of the present invention adopted for an elimination technique to remove dominant peaks for more accurate assessment of minor peaks.

The selective RF pre-pulse is constructed from noise. A random noise generation routine can be found for most computers, which usually creates a sequence of random numbers with an equal probability of occurrence over a pre-determined range. For the case considered in this discussion, the noise sequence consisted of 512 complex points, with both the real and imaginary components randomly chosen to have a distribution centred around zero. This sequence was used to represent an initial selective irradiation spectrum. If the NMR spins in a central slice of the object are to be left unperturbed, the corresponding frequency components in the irradiation spectrum must be removed. This is achieved by setting a consecutive number of points to zero in the centre of the irradiation spectrum. A nonselected slice of corresponding frequency width is thus left unperturbed when the pulse is applied in conjunction with a field gradient. A suitable noise distribution is shown in FIG. 1A, with the central 20 points set to zero in both the real and imaginary frequency domains.

The selective RF pulse shape is generated by Fourier transformation of the irradiation spectrum and is shown in FIG. 1B. After application of this RF pulse shape in conjunction with a magnetic field gradient, the spin magnetization has undergone varying degrees of nutation as a function of position along the selection axis. For RF power levels greater than a minimum value, the longitudinal magnetization outside the unperturbed slice is randomized in size and polarity, and for objects with reasonable spatial homogeneity, will average to zero. The transverse magnetization excited by this pulse can then be allowed to decay before application of subsequent experiments. Since the NMR spins of interest remain unperturbed, the NMR signal measured by a suitable spatial localization technique will contain a full signal contribution from the selected spins, and a greatly reduced error signal originating from these outer regions.

FIG. 1C shows a computer simulation of the effect of this selective noise pulse on the longitudinal magnetization immediately following the pulse period. A uniform spin distribution along the selection axis has been assumed. Nutation of the NMR spins during application of the pulse has been calculated by application of successive matrix operators according to boundary conditions specified by the Bloch equations R. J. Ordidge, Ph.D. Thesis, Nottingham University, England (1981). For non-uniform samples, the residual net longitudinal magnetization should average to zero because of the high frequency components in the noise excitation spectrum. Minor variations in the applied RF pulse power can be used to effectively ensure that this condition is reached. For a ten millisecond selective pulse, the frequency bandwidth of the unperturbed slice is approximately 2 kHz, compared to a total frequency bandwidth of 51.2 kHz, within which the remaining magnetization is randomized.

Three selective pre-pulses are required in order to achieve complete randomization of longitudinal magnetization along all three spatial axes. These pulses however may be applied consecutively as shown in FIG. 4.

The effect of the selective noise pulse can be compared with a selective $\pi/2$ pulse of the same frequency bandwidth. A selective $\pi/2$ pulse nutates all magnetization into the transverse plane, and the NMR signal is then allowed to dephase under the influence of a field gradient, as described by D. D. Doddrell, G. G. Galloway, W. M. Brooks, J. M. Bulsing, J. C. Field, M. G. Irving and H. Baddeley; Magn. Reson. Med. 3, 970 (1986). This randomization process is different from the action of a selective noise pulse, which randomizes the residual longitudinal magnetization. However, in both cases the net effect is to remove signal contributions from unwanted regions of the sample during the subsequent acquisition period. An advantage of the noise pulse compared with the $\pi/2$ selective pulse of equal frequency bandwidth is the considerable saving in RF power, which amounts to at least a factor of 50 in the present case. The noise pulse is more efficient because of the randomness of the irradiation spectrum. This generates a selective pulse with very little coherence between frequency components. Therefore, the resultant RF modulation function does not contain any intervals during which a large RF amplitude is required since the individual frequency components do not become coherent in phase.

A rectangular non-selective RF pulse is the most efficient means of nutating NMR magnetization, and can be used as the standard by which all other pulses are judged. In general we can consider a selective noise pulse as a random sequence of RF amplitude variations applied as a function of time. Application of this waveform causes NMR spins to experience the net effect of N individual RF pulses of random sign and size, where N is the number of time intervals used to represent the selective pulse waveform. Since any average random noise level increases by the square root of the number in the average, then the average effect of the pulse will be to cause a nutation which is $\sqrt{N}$ times larger than that occurring during any single time interval in the pulse waveform. However, compared with a rectangular RF pulse of equal duration, the noise pulse is $\sqrt{N}$ times less efficient since all N RF pulses cause an additive increment in the excitation angle during the rectangular pulse. This is compensated by the fact that the noise pulse has an excitation frequency bandwidth which is N times larger than the rectangular pulse. A rectangular $\pi/2$ pulse with the same excitation bandwidth would require a much larger RF power than the noise pulse. The noise pulse however, muse produce spin nutations of up to $\pm\pi$, and therefore is only $\sqrt{N}/2$ times more efficient in RF amplitude than the equivalent frequency selective $\pi/2$ pulse, or N/4 times more efficient in RF power.

The most convenient way of expressing the efficiency of the noise pulse is to compare its performance with a rectangular non-selective $\pi/2$ pulse. If $B_1$ represents the amplitude of a rectangular non-selective $\pi/2$ pulse of fixed duration, then in the case considered here, an RF amplitude of 492 would be required to achieve the desired effect using a single selective pulse as described by D. D. Doddrell, G. G. Galloway, W. M. Brooks, J. M. Bulsing, J. C. Field, M. G. Irving and H. Baddeley; Magn. Reson. Med. 3, 970 (1986). This assumes that both pulses are of equal duration.

The graph of FIG. 2 shows the variation of residual longitudinal magnetization outside the unperturbed slice as a function of the applied RF amplitude of the noise pulse. The first zero-crossing occurs at a normalized amplitude of 69$B_1$. The aforementioned theory predicts that the noise pulse should be $\sqrt{N}/2$ times more efficient than a selective pulse of equal duration and excitation bandwidth. For a pulse with 512 time intervals, this predicts a zero net longitudinal magnetization at a relative RF amplitude of 45$B_1$. Therefore, with this particular method of noise generation a selective pulse is produced with a relatively poor efficiency in randomizing the spin system. At higher RF amplitudes the residual longitudinal magnetization oscillates in polarity with a decaying amplitude, however the profile of unperturbed longitudinal magnetization begins to deteriorate at the edges of the non-selected slice. These oscillations could prove useful in the optimization of RF amplitude for maximum cancellation of unwanted signal with non-uniform samples. The dependence of net residual magnetization upon RF amplitude is greatly reduced at higher levels of RF amplitude.

Unfortunately, the noise pulse does not cause an even range of spin nutation angles across the complete excitation spectrum of the pulse. This feature, which is common to all selective pulses, is caused by the application of a discrete RF pulse shape rather than a continuous function. The effect of discreteness in the RF waveform may be calculated by considering the excitation spectrum of a $\pi/2$ RF pulse with a time duration which is equal to the individual intervals in the waveform. The nutation angle for off-resonance spins may therefore be calculated, and the corresponding frequency components in the selective pulse adjusted to compensate this effect. The required correction necessitates multiplying the relevant frequency components by a factor which is equal to $\pi/2$ divided by the calculated nutation angle in radians. The correction function $C(\omega)$ is described by the equation:

$$C(\omega) = \pi/2\theta \quad [1]$$

where $$c(w) = \pi/2\theta \quad [1]$$

where [2]

$$\theta = \arccos\left[\frac{\omega^2 + (\pi/2\tau)^2 \cos\left[\left(\frac{\pi^2}{4}\right) + \omega^2\tau^2\right]^{\frac{1}{2}}}{\omega + \left(\frac{\pi}{2\tau}\right)^2}\right]$$

$\omega$ is the angular frequency offset for the initial irradiation spectrum, and $\tau$ is the time duration of the discrete intervals in the selective pulse shape.

The noise spectrum muse therefore be substantially increased in amplitude for large frequency offsets in order to maintain an even frequency response over the excited bandwidth of the pulse. This modification has been included in the calculation of previous results.

Further refinement of the selective pulse can be achieved by modification of the noise characteristics in the irradiation spectrum. Instead of using two independent noise amplitudes to represent the quadrature components of the irradiation spectrum, a random noise can be generated in the polar coordinate system using a constant amplitude with a random phase angle. The resultant excitation pulse requires less RF power to achieve a zero in net residual magnetization, however the oscillations in residual magnetization at high RF amplitudes are much larger. FIG. 3 shows the net residual longitudinal magnetization plotted against RF amplitude for a uniform sample. The first zero-crossing occurs at an RF amplitude of approximately $50B_1$, which is much closer to the theoretical value of $45B_1$. The saving in RF power compared to a $\pi/2$ selective pulse of equal duration and similar effect, is now approximately a factor of 95.

Other forms of noise modulation can be used. The dependence of net longitudinal magnetization upon RF amplitude can be varied by changing the noise characteristics.

A selective pre-pulse has been described which causes destruction and cancellation of the unwanted spin magnetization from regions outside the selected slice. Three such pulses may be applied consecutively in order to leave an unperturbed volume of material that can subsequently be investigated using a spatial localization technique such as ISIS, as shown in FIG. 4. With reference now to FIG. 4 the pulse sequence is shown for gradients Gx, Gy and Gz with the shaped RF pulse shown for each gradient pulse. The gradient and RF pulses are followed in known manner by a spatial localization experiment or alternatively an NMR imaging experiment. Application of these pre-pulses should greatly reduce the error signals from unwanted volumes of tissues, and will thus extend the usefulness of the ISIS technique.

A similar pulse might be used to remove broad resonance lines in standard NMR spectroscopy, and may also be useful in the production of "zoomed" images in NMR imaging. This technique also makes the spatial localization procedure much less sensitive to subject motion during the NMR study.

Erroneous signal can be caused by non-cancellation of signal responses from tissue which moves during the experimental sequence. The noise pulse tends to randomize longitudinal magnetization within these moving organs which provides more effective signal cancellation.

Figure 5C:
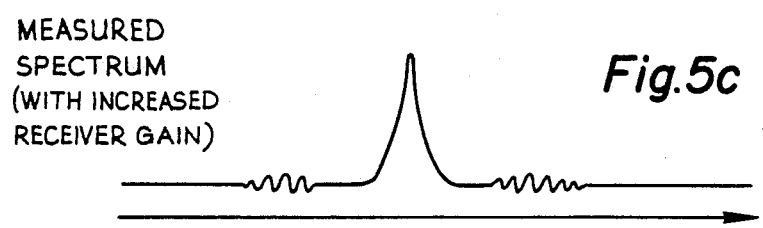

The technique can be added to any NMR sequence in order to minimize the signal response from volumes of tissue outside the region of interest. Alternatively signal frequency components (e.g. lines in the chemical shift spectrum) may be removed by pre-excitation with the selective noise pulse as shown in FIG. 5. With reference to FIG. 5 by application of one shaped pulse with spectral noise bands identified by SP1 and SP2, major peaks P1 and P2 in a spectrum can be eliminated using the techniques of the present invention thereby enabling the receiver gain to be increased and thereby enhancing the minor peak P3 by better use of the A to D converter (see FIG. 5c)

The shape of the noise pulse is generated from an initial irradiation spectrum consisting of an array of $2^N$ real points and $2^N$ imaginary points where N is an integer. Any number or distribution of these points may be set to zero, and the remainder is filled with a random noise pattern. A distribution of gaps in the noise spectrum is thus generated and the shape of the selective RF pulse is produced by Fourier transformation of the irradiation spectrum. Signal within these frequency gaps therefore remains unperturbed after application of this pulse, whereas parts of the sample which have experienced the effect of the noise pulse produce a markedly reduced signal through randomization of the longitudinal magnetization.

The technique can be combined with NMR imaging to produce images of zoomed regions of the sample. The technique can also be combined with chemical shift imaging to produce chemical shift images of inner volumes within the sample. Finally, the method may be applied with any of the existing spatial localization procedures.

I claim:

1. A method of eliminating NMR signals from unwanted frequency bands in NMR systems comprising (a) providing a shaped RF pulse comprising at least two regions of frequency bands of random frequency components between which at least one frequency band region of zero components is situated and (b) detecting the NMR signal output from the frequency band region of zero components.

2. A method of accurate definition of a desired volume of material in NMR systems within a large sample by removal of unwanted signal comprising (a) applying a shaped RF pulse in conjunction with a linear magnetic field gradient which effectively randomizes the net longitudinal spin magnetization in all volumes outside the selected volume and (b) detecting the NMR signal output from the selected volume.

3. A method as claimed in claim 2 wherein one shaped RF pulse and gradient is used to leave unperturbed a slice which includes the desired volume.

4. A method as claimed in claim 2 wherein two shaped RF pulses and gradients are used to leave unperturbed a column which includes the desired volume.

5. A method as claimed in claim 2 wherein three shaped RF pulses and gradients are used to leave unperturbed the desired volume which is thereby defined as a retanguloid volume.

6. A method as claimed in claim 2 in which the shaped RF pulse has spectral components which are random over a defined frequency band and has no spectral components in a specified frequency band.

7. A method as claimed in claim 6 in which the RF pulses and gradients provide NMR or chemical shift imaging.

8. A method as claimed in claim 2 in which each shaped RF pulse has spectral components which are random in phase only.

9. A method as claimed in claim 2 in which noise signals of any characteristic are used to generate the random spectral components of the shaped RF pulse.

10. A method as claimed in claim 2 in which the application of the shaped RF pulse is used in conjunction with a form of localized spatial techniques to provide an accurately defined localized volume.

* * * * *